United States Patent [19]
Kawasaki

[11] Patent Number: 5,687,180
[45] Date of Patent: Nov. 11, 1997

[54] METHOD AND CIRCUIT FOR CHECKING OPERATION OF INPUT BUFFERS OF A SEMICONDUCTOR CIRCUIT

[75] Inventor: Soichi Kawasaki, Tokyo, Japan

[73] Assignee: Kabushiki Kaisha Toshiba, Kawasaki, Japan

[21] Appl. No.: 454,702

[22] Filed: May 31, 1995

Related U.S. Application Data

[63] Continuation of Ser. No. 807,639, Dec. 13, 1991, abandoned, which is a continuation of Ser. No. 577,064, Sep. 4, 1990, abandoned, which is a continuation of Ser. No. 29,725, Mar. 24, 1987, abandoned.

[30] Foreign Application Priority Data

Mar. 29, 1986 [JP] Japan ................... 61-72166

[51] Int. Cl.$^6$ ................... G01R 31/3173; G01R 31/3185
[52] U.S. Cl. ................... 371/28; 371/22.3
[58] Field of Search ................... 371/22.3, 28

[56] References Cited

U.S. PATENT DOCUMENTS

| | | | |
|---|---|---|---|
| 3,761,695 | 9/1973 | Eichelberger | 371/22.3 |
| 3,790,885 | 2/1974 | James | 324/73 R |
| 4,074,150 | 2/1978 | Buckley, III et al. | 307/362 |
| 4,357,703 | 11/1982 | Van Brunt | 371/22.5 |
| 4,488,259 | 12/1984 | Mercy | 371/22.3 |
| 4,503,386 | 3/1985 | Das Gupta et al. | 371/22.3 |
| 4,566,104 | 1/1986 | Bradshaw et al. | 371/22.3 |

FOREIGN PATENT DOCUMENTS

| | | |
|---|---|---|
| 59175133 | 10/1984 | Japan . |
| 60-82871 | 5/1985 | Japan . |

OTHER PUBLICATIONS

Williams et al., Proceedings Of The IEEE, vol. 71, No.1 (Jan. 1983), pp. 98–112, "Design for Testability–A Survey".
Patent Abstracts Of Japan, vol. 8, No. 48 (Mar. 3, 1984) p. 258.
Gschwind, H. et al., *Design of Digital Computers*, Springer-Verlag, 1975, pp. 68–70.
Komonytsky, D., "Synthesis of Techniques Creates Complete System Self-Test", *Electronics*, Mar. 10, 1983, pp. 110–115.
IBM Technical Disclosure Bulletin, Goel et al., "Functionally Independent AC Test for Multi-Chip Packages", vol. 25, No. 5, Oct. 1982, pp. 2308–2310.
Classnotes for LSI Logic's CMOS Gate Array Training Class for the LDS III, p. 63, Testing, Jul. 1985.

*Primary Examiner*—Stephen M. Baker
*Attorney, Agent, or Firm*—Finnegan, Henderson, Farabow, Garrett & Dunner, L.L.P.

[57] ABSTRACT

Output signals of input buffers connected to the external input terminals of the semiconductor circuit are stored in respective memories. The memories are connected in series. Data of the memories are serially output from an external output terminal of the semiconductor circuit. In the above-mentioned operations, a pulse for storing the output signals of the input buffers into the memories, for selecting one of an output signal of the internal circuit and the data stored in the memories, and outputting the selected one from the external output terminal, is supplied via another external input terminal for a test. A pulse for connecting the memories in series is also supplied via a further external input terminal. The output signals of the input buffers can be output from the semiconductor circuit, without any operation of the internal circuit.

11 Claims, 2 Drawing Sheets

5,687,180

METHOD AND CIRCUIT FOR CHECKING OPERATION OF INPUT BUFFERS OF A SEMICONDUCTOR CIRCUIT

This application is a continuation of application Ser. No. 07/807,639 filed Dec. 13, 1991, which is a continuation of application Ser. No. 07/577,064 filed Sep. 4, 1990, which is a continuation of application Ser. No. 07/029,725 filed Mar. 24, 1987, all now abandoned.

BACKGROUND OF INVENTION

This invention relates to an input voltage signal check circuit for a semiconductor integrated circuit, and, more particularly, to improvements in stability and operability of the input signal checking operation.

Generally, a semiconductor integrated circuit is constructed with a number of transistors fabricated on a single silicon wafer chip.

In order to check whether or not the manufactured semiconductor circuit responds to an input signal of a predetermined voltage, the entire semiconductor circuit is operated in an AC test mode or a function test mode.

However, in the check operation of the input voltage signal, the results of the check are greatly influenced by the measuring instruments used, because the check involves the operation of the entire semiconductor circuit. Specifically, in the check of the input voltage signal, the internal circuit of the semiconductor circuit is dynamically operated. When, therefore, an input voltage signal is input from the measuring system to the internal circuit according to the inspection specification, a change in the characteristic of the internal circuit influences the level of the input voltage signal, possibly causing an erroneous operation of the measuring system. It is difficult to check whether the erroneous operation is due to the internal circuit or the measuring system. Considerable time is required for securing a stable test. Further, when the manufacturing of the semiconductor circuit enters a mass production stage, different measuring systems are used and similar problems are also created, necessitating a significant amount of time for the inspection process.

SUMMARY OF THE INVENTION

Accordingly, an object of the invention is to provide an input voltage signal check circuit in a semiconductor integrated circuit, which can stably and easily check, without having any influence on the measuring system, whether or not the semiconductor circuit responds to an input voltage signal of a predetermined voltage.

To achieve the object, according to the input voltage signal check circuit for a semiconductor integrated circuit, the output signals of input buffers connected to the external input terminals of the semiconductor circuit are stored in respective memories connected to the output terminals of the input buffers. The memories are connected in series. Output signals of the memories are serially output from an external output terminal of the semiconductor circuit. In the above-mentioned operations, a pulse is supplied via another external input terminal for storing the output signals of the input buffers into the memories, for selecting one of an internal circuit output and the data stored in the memories, and outputting the selected one from the external output terminal. A pulse for connecting the memories in series is also supplied via a further external input terminal. The output signals of the input buffers are output from the semiconductor circuit, without any operation of the internal circuit.

According to the invention, there is provided an input voltage signal check circuit for a semiconductor integrated circuit comprising:

a plurality of external input terminals of a semiconductor integrated circuit;

an external output terminal of said semiconductor integrated circuit;

a plurality of input buffers coupled respectively with said input terminals;

a plurality of memories respectively coupled with the outputs of said input buffers;

means for connecting said memories and said external output terminal in series; and means for successively reading out the data stored in said memories via said external output terminal.

DETAILED DESCRIPTION OF THE PREFERRED EMBODIMENT

An input voltage signal check circuit system and method for a semiconductor integrated circuit according to an embodiment of the invention will now be described referring to FIGS. 1 and 2.

Figure 1:
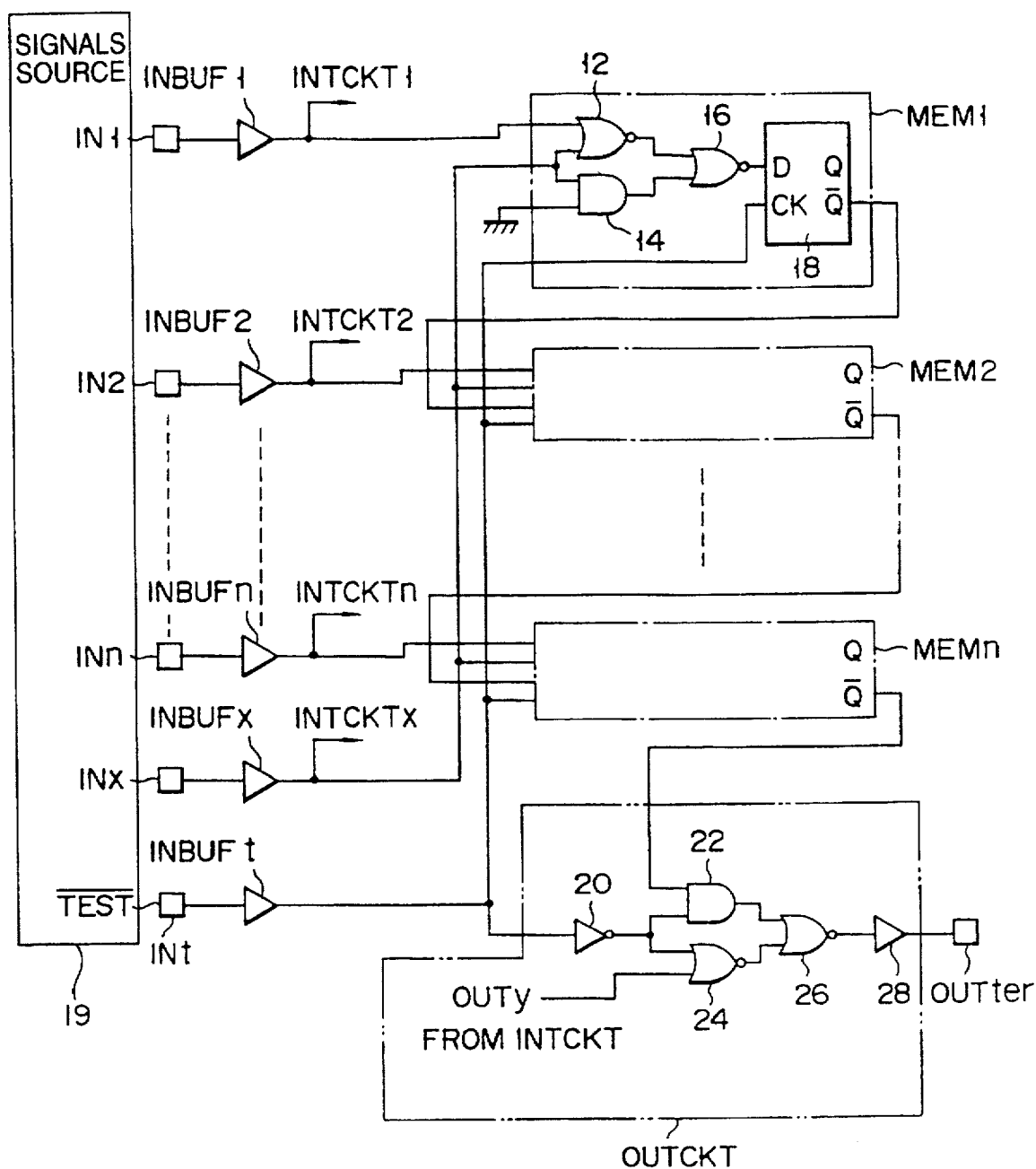
FIG. 1 shows a circuit diagram of an input voltage signal check circuit for a semiconductor integrated circuit, according to an embodiment of the present invention.
Figure 2:
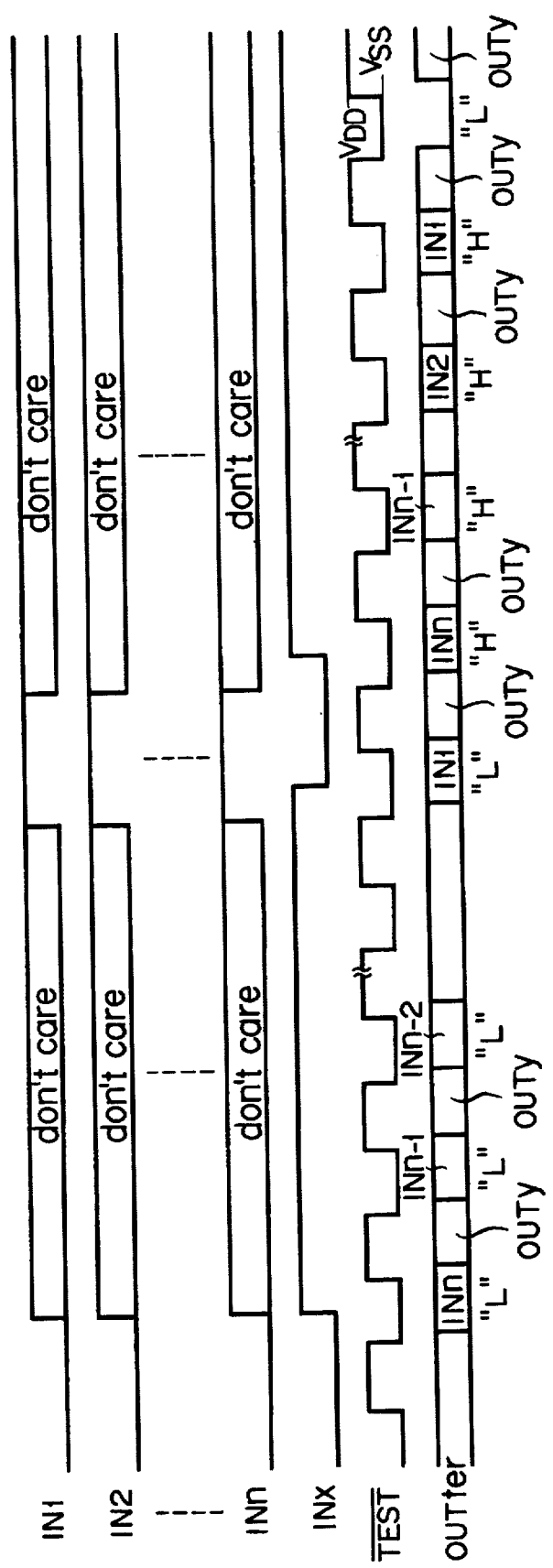
FIG. 2 shows a signal chart in the operation of the check circuit of FIG. 1.

It is assumed in FIG. 1 that IN1, IN2, . . . , INn, and INx designate input terminals, and assumed in FIG. 2 that they designate the signals at those input terminals. It is also assumed in FIG. 1 that OUTter designates an output terminal of the whole semiconductor circuit, and assumed in FIG. 2 that it designate an output signal of the output terminal OUTter. It is further assumed that, in FIGS. 1 and 2, $\overline{\text{TEST}}$ and OUTy designate a test signal and an output signal of the internal circuit, respectively.

Input terminals IN1, IN2, . . . , INn are connected to input terminals of input buffers INBUF1, INBUF2, . . . , INBUFn, respectively. Input terminal INx is connected to the input terminal of input buffer INBUFx. Input terminal INt forms a test terminal to which test signal $\overline{\text{TEST}}$ is input from signals source 19. The test terminal INt is connected to the input terminal of input buffer INBUFt. The output terminals of input buffers INBUF1, INBUF2, . . . , INBUFn, and INBUFx are connected to internal circuits INTCKT1, INTCKT2, . . . , INTCKTn, and INTCKTx (not shown) in the semiconductor circuit, respectively. The output terminals of input buffers INBUF1, INBUF2, . . . , INBUFn are connected to memories MEM1, MEM2, . . . , MEMn, respectively. The output terminals of input buffers INBUFx and INBUFt are connected to memories MEM1, MEM2, . . . , MEMn.

Memories MEM1, MEM2 . . . , MEMn have substantially the same configurations, except for some connections.

Memory MEM1 comprises 2-input NOR gates 12 and 16, 2-input AND gate 14, and D-type flip-flop (D-FF) 18. The first input terminal of NOR gate 12 is connected to the output terminal of input buffer INBUF1. The second input terminal is connected to the output terminal of input buffer INBUFx. The first input terminal of AND gate 14 is connected to the output terminal of input buffer INBUFx. The second input terminal of AND gate 14 is connected to ground. The output terminals of NOR gate 12 and AND gate 14 are connected to the first and second input terminals of NOR gate 16, respectively. The output terminal of NOR gate 16 is connected to the D-terminal of flip-flop D-FF 18. The CK-terminal of flip-flop D-FF 18 is connected to the output terminal of input buffer INBUFt. The $\overline{Q}$ output terminal of flip-flop D-FF 18 is connected to the second input terminal of the AND gate (not shown) in memory MEM2. The second input terminal of the AND gate in memory MEM2 corresponds to the second input terminal connected to ground, of AND gate 14 in memory MEM1.

Other memories MEM2, . . . , MEMn have the same circuit configurations, except for some connections. Therefore, the different connections will only be given, for simplicity of the description.

The second input terminals of the AND gates in other memories MEM2, . . . , MEMn, each of which corresponds to the second input terminal connected to ground, of the AND gate 14 in memory MEM1, are connected to the $\overline{Q}$ output terminals of the flip-flops of the preceding stage memories MEM1, . . . , MEMn-1, respectively. The $\overline{Q}$ output terminal of the final stage memory MEMn is connected to output circuit OUTCKT. Output circuit OUTCKT is also connected to the output terminal of input buffer INBUFt. Output signal OUTy of the internal circuit is also input to output circuit OUTCKT.

Output circuit OUTCKT comprises inverter 20, AND gate 22, NOR gates 24 and 26, and output buffer 28. The output terminal of input buffer INBUFt is connected via inverter 20 to first input terminals of AND gate 22 and NOR gate 24. The second input terminal of AND gate 22 is connected to the $\overline{Q}$ output terminal of the D-type flip-flop (not shown) of final stage memory MEMn, which corresponds to the $\overline{Q}$ output terminal of D-type flip-flop 18 of the first stage memory MEM1. Output signal OUTy of the internal circuit is input to the second input terminal of NOR gate 24. The output terminals of AND gate 22 and NOR gate 24 are connected to the first and second input terminals of NOR gate 26, respectively. The output terminal of NOR gate 26 is connected to external output terminal OUTter of the whole semiconductor circuit via output buffer 28.

The operation of the input voltage signal check circuit shown in FIG. 1 will be described.

First, in brief, "L" (low) level input signals of a predetermined voltage are supplied to the input buffers via the external input terminals of the semiconductor circuit. The output signals of the input buffers are stored in the respective memories. Data stored in the memories are successively read out via the external output terminal. If the data read out from the memories are "L" level, one can know that the input buffers responded to the predetermined voltage input signal.

On the other hand, "H" (high) level input signals of a predetermined voltage are supplied to the input buffers via the external input terminals of the semiconductor circuit. The output signals of the input buffers are stored in the respective memories. Data stored in the memories are successively read out via the external output terminal. If the data read out from the memories are "H" level, it indicates that the input buffers responded to the predetermined voltage input signal.

Specifically, "L" level input signals of a predetermined voltage are supplied to external input terminals IN1, IN2, . . . , INn, and INx. A clock pulse used as test signal TEST, whose "L" level corresponds to a low power source potential "$V_{SS}$" and whose "H" level corresponds to a high power source potential "VDD", is input to external input terminal INt. At this time, if input buffer INBUF1, . . . , INBUFn, and INBUFx respond to the predetermined voltage input signal, the output signals of input buffers INBUF1, . . . , INBUFn, and INBUFx are "L" level.

The "L" level output signal of input buffer INBUF1 is stored in memory MEM1 as "L" level data. Specifically, the "L" level output signal of input buffer INBUF1 is input to the first input terminal of NOR gate 12 in memory MEM1. The second input terminal of NOR gate 12 is supplied with the "L" level signal from input buffer INBUFx. Accordingly, an "H" level signal is output from NOR gate 12. The "H" level output signal is input to the first input terminal of NOR gate 16. Upon receipt of the "H" level signal, NOR gate 16 outputs an "L" level signal. In synchronism with test signal TEST, i.e. a clock pulse input supplied from test input terminal INt via input buffer INBUFt, the "L" level signal of NOR gate 16 is input to flip-flop D-FF 18 and stored therein. In this way, the output signal of input buffer INBUF1 is stored in memory MEM1.

The storing operations of output signals of input buffers INBUF2, . . . , INBUFn into the respective memories MEM2, . . . , MEMn are substantially the same as that of the storing of output signal of input buffer INBUF1 into memory MEM1. Specifically, the "L" level output signals of input buffers INBUF2, . . . , INBUFn are stored as "L" level data in memories MEM2, . . . , MEMn, respectively.

When input clock signal TEST supplied to test terminal INt is changed from high "H" to "L" level, instead of output signal OUTy of the internal circuit, the "L" level data stored in memory MEMn, which corresponds the "L" level signal input to input terminal INn, is output from external output terminal OUTter of the semiconductor circuit.

When the input signal to input terminal INx is set to be "H", memories MEM1, . . . , MEMn are connected in series. Under this condition, when a clock pulse TEST is successively input to input terminal INt, the "L" level data stored in memories MEMn, . . . , MEM2, MEM1, which correspond to the "L" level signals input to input terminals INn, . . . , IN2, IN1, are successively output in order. After the number of pulses which is less by one than the number of input buffers INBUF1, INBUF2, . . . , INBUFn are input, the "L" level data stored in all the memories MEM1, MEM2, . . . , MEMn are output. Therefore, one can know that input buffers INBUF1, INBUF2, . . . , INBUFn normally operate with regard to the "L" level input signals of the predetermined voltage supplied to input terminals IN1, IN2, . . . , INn.

The above-mentioned operation, performed when "L" level input signals of a predetermined voltage are input to input terminals IN1, IN2, . . . , INn, can be applied, by replacing the "L" level with an "H" level, to that operation performed when "H" level input signals of a predetermined voltage are input to the input terminals.

Specifically, "H" level input signals of a predetermined voltage are supplied to external input terminals IN1, IN2, . . . , INn, and INx. A clock pulse used as test signal TEST, whose "L" level corresponds to a low power source potential "$V_{SS}$" and whose "H" level corresponds to a high power source potential "$V_{DD}$", is input to external input terminal INt. At this time, if input buffer INBUF1, . . . , INBUFn, and INBUFx respond to the predetermined voltage input signal, the output signals of input buffers INBUF1, . . . , INBUFn, and INBUFx are "H" level.

The "H" level output signal of input buffer INBUF1 is stored in memory MEM1 as "H" level data. Specifically, the "H" level output signal of input buffer INBUF1 is input to the first input terminal of NOR gate 12 in memory MEM1. The second input terminal of NOR gate 12 is supplied with the "L" level signal from input buffer INBUFx. Accordingly, an "L" level signal is output from NOR gate 12. The "L"

level output signal is input to the first input terminal of NOR gate 16. Upon receipt of the "L" level signal, NOR gate 16 outputs an "H" level signal. In synchronism with test signal TEST, i.e. a clock pulse input supplied from test input terminal INt via input buffer INBUFt, the "H" level signal of NOR gate 16 is input to flip-flop D-FF 18 and stored therein. In this way, the output signal of input buffer INBUF1 is stored in memory MEM1.

The storing operations of output signals of input buffers INBUF2, . . . , INBUFn into the respective memories MEM2, . . . , MEMn are substantially the same as that of the storing of output signal of input buffer INBUF1 into memory MEM1. Specifically, the "H" level output signals of input buffers INBUF2, . . . , INBUFn are stored as "H" level data in memories MEM2, . . . , MEMn, respectively.

When input clock signal $\overline{TEST}$ supplied to test terminal INt is changed from high "H" to "L", instead of output signal OUTy of the internal circuit, the "H" level data stored in memory MEMn, which corresponds the "H" level signal input to input terminal INn, is output from external output terminal OUTter of the semiconductor circuit.

When the input signal to input terminal INx is set to be "H", memories MEM1, . . . , MEMn are connected in series. Under this condition, when a clock pulse $\overline{TEST}$ is successively input to input terminal INt, the "H" level data stored in memories MEMn, . . . , MEM2, MEM1, which correspond to the "H" level signals input to input terminals INn, . . . , IN2, IN1, are successively output in order. After the number of pulses which is less by one than the number of input buffers INBUF1, INBUF2, . . . , INBUFn are input, the "H" level data stored in all the memories MEM1, MEM2, . . . , MEMn are output. Therefore, it is possible to determine that input buffers INBUF1, INBUF2, . . . , INBUFn operate normally with regard to the "H" level input signals of the predetermined voltage supplied to input terminals IN1, IN2, . . . , INn.

After the "L" or "H" level data stored in all memories MEMn, . . . , MEM1 are output, it can be determined, by inputting one additional pulse to input terminal INt, whether or not memories MEM1, MEM2, . . . , MEMn are connected in series. When an additional pulse is supplied to input terminal INt and the output signal appearing on output terminal OUTter is "L" level, it is can be determined that all the memories are connected in series.

In order to ascertain the critical voltage of input buffers INBUF1, INBUF2, . . . , INBUFn with regard to the predetermined voltage of the "L" level input signals, the input voltages applied from signals source 19 to input terminals IN1, IN2, . . . , INn are gradually increased. The voltage at which the output signals appearing on output terminal OUTter are changed from "L" level to "H" level is the critical voltage.

On the other hand, in order to ascertain the critical voltage of input buffers INBUF1, INBUF2, . . . , INBUF2n with regard to the predetermined voltage of the "H" level input signals, the input voltages applied from signals source 19 to input terminals IN1, IN2, . . . , INn are gradually decreased. The voltage at which the output signals appearing on output terminal OUTter are changed from "H" level to "L" level is the critical voltage.

It should be understood that this invention is not limited to the above-mentioned embodiment. In the embodiment of FIG. 1, the output signals of the internal circuit and the check circuit are output via the common external output terminal of the semiconductor circuit. That is to say, the external output terminal of the semiconductor circuit is used in a multiplex fashion. If an excessive number of external output terminals is provided, one of those terminals, which is not used as the output terminal of the internal circuit, may be used only as the output terminal of the check circuit.

When a number of input terminals are used, the input terminals may be grouped and one output terminal may be assigned to each of those groups.

In the embodiment of FIG. 1, the output signal of input buffer INBUFx is used for control of the memories. Therefore, the input signal check of input buffer INBUFx can be executed by another check block. In such a case, input terminal INx is used as a test terminal to which a clock signal is applied whose high level is a high power source potential "$V_{DD}$" and whose low level is a low power source potential "$V_{SS}$".

In the embodiment of FIG. 1, the input voltage signal check is performed in the DC mode. The check operation is performed only for the duration of an "L" level of the input signal applied to input terminal INx, as seen in the signal chart of FIG. 2. This implies that during an "H" level of the input signal to input terminal INx, it is possible to input an external signal to the semiconductor circuit. This implies that, during the "H" level of the input signal applied to input terminal INx, the input voltages applied to input terminals IN1, . . . , INn can be checked while allowing the operation of the internal circuits. The "H" level duration of the input signal at input terminal INx is a so-called "don't care" period.

Conventionally, in checking the input voltage signal of the semiconductor circuit, the output signal of the input buffer cannot be detected directly from the outside of the semiconductor circuit. To cope with this, the internal circuits are operated by the input signals of the check voltage level, and a check is made as to whether the internal circuits are erroneously operated or not. This check requires the dynamic input of the signal. Therefore, the measuring system must be constructed accurately, in order to check precisely whether the cause of the erroneous operation of the internal circuits resides in the internal circuit or in the measuring system. In order to realize a correct check, therefore, a significant amount of time is required. Appropriate circuit modification is required for the test in the mass production stage, consuming a significant amount of time.

According to the input voltage signal check circuit of the present invention, the input voltage signal can be checked in a DC manner. In other words, the input voltage signal can be checked without operating the internal circuit of the semiconductor circuit. Therefore, the internal circuits can be stably and easily checked. If the computer-aided design (CAD) system is satisfactorily improved in the future, the present invention is highly suitable for such a semiconductor integrated circuit whose pattern is defined as the standard cell LSI (large scale integration) or the gate array.

What is claimed is:

1. A method for determining operation characteristics of input buffers of a semiconductor integrated circuit, said semiconductor integrated circuit comprising a plurality of input terminals; input buffers which are respectively provided for said input terminals, for receiving input signals from said input terminals; and leading means for leading output signals of the input buffers to an output terminal; said method comprising the steps of:

applying a plurality of different input testing voltages to said input terminals to test characteristics of the input buffers, including gradually changing the input testing voltages to critical voltages at which operation of the input buffers change; and measuring output signals of the input buffers in response to the input voltages to determine operation limits of the input buffers, the operation limits occurring at the critical voltages, wherein said leading means includes nothing to distort the output signals of the input buffers.

2. A method according to claim 1, wherein
said leading means comprises:
storage circuits provided for said input buffers, respectively; and
a circuit for connecting the storage circuits in series with respective ones of said input buffers using a control signal and for leading the output signals from said input buffers to said output terminal, and
said method comprises the step of, after applying said plurality of different voltages to said input terminals and holding the output signals of the input buffers in response to the input voltages in the storage circuits, measuring signals stored in the storage circuits to determine the operation limits of the input buffers.

3. A method for checking operation states of input buffers of a semiconductor integrated circuit, said semiconductor integrated circuit comprising a plurality of input terminals; input buffers which are respectively provided for said input terminals, for receiving input signals through said input terminals; and leading means for leading input signals of said input buffers to an output terminal, said method comprising the steps of:

applying to said input terminals, allowable levels of testing voltages as the input signals for the input buffers to test characteristics of the input buffers, including gradually changing the levels of testing voltages to critical voltages at which operation of the input buffers change; and measuring output signals of the input buffers in response to the allowable levels of voltages to check operation states of said input buffers, changes of the operation states occurring at the critical voltages, wherein leading means includes nothing to distort the output signals of the input buffers.

4. A method according to claim 3, wherein
said leading means comprises:
storage circuits provided for said input buffers, respectively; and
a circuit for connecting the storage circuits in series with respective ones of said input buffers using a control signal and for leading output signals of said input buffers to said output terminal, and
said method comprises the step of, after applying to said input terminals the allowable levels of voltages for said input buffers and holding the output signals of said input buffers in response to the allowable levels of voltages in the storage circuits, measuring signals in the storage circuits to check operation states of said input buffers.

5. A semiconductor integrated circuit system, comprising:
a plurality of input terminals for a semiconductor integrated circuit;
input buffers which are provided for the input terminals, respectively, for receiving input testing signals from said input terminals, to test characteristics of the input buffers;
internal circuits of the semiconductor integrated circuit, connected to the input buffers;
an output terminal used for determining operation states of the input buffers, and means for applying a plurality of different voltages as the input testing signals to the input terminals, gradually changing the plurality of different voltages to critical voltages at which operation of the input buffers change and measuring output signals of the input buffers, which are output in response to the plurality of different voltages; and leading means for leading the output signals of the input buffers to said output terminal, without passing through the internal circuits,
wherein said leading means includes nothing to distort the output signals of the input buffers.

6. A semiconductor integrated circuit system according to claim 5, wherein
said plurality of different voltages are allowable voltages for the input buffers.

7. A semiconductor integrated circuit system according to claim 5, wherein
said leading means comprises:
storage circuits provided for the input buffers, respectively; and
a circuit for connecting the storage circuits in series with respective ones of said input buffers using a control signal and for leading the output signals of the input buffers to the output terminal.

8. A semiconductor integrated circuit system according to claim 7, wherein
said plurality of different voltages are allowable voltages for the input buffers.

9. A method of testing using a semiconductor integrated circuit having a plurality of input terminals, a plurality of input buffers each connected to one of said plurality of input terminals, an external output terminal, and internal circuits connectable between respective ones of the input buffers and the external output terminal, comprising the steps of:

inputting input signals into said plurality of input terminals to drive the plurality of input buffers, including gradually changing the input signals to critical voltage at which operation of the input buffers change;

latching an output signal of each of said input buffers; and successively outputting said output signals of said input buffers to the external output terminal, undistorted by operation of the internal circuits of the semiconductor integrated circuit, to test whether the input buffers each indicate whether a respective one of the input signals has an allowable voltage, wherein said leading means includes nothing to distort the output signals of the input buffers.

10. The method of testing according to claim 9, wherein the step of inputting input signals includes selecting input signals that have allowable voltages, whereby each of the input buffers indicates whether it is operating correctly by indicating whether the respective input signal has an allowable voltage.

11. A method of testing using a semiconductor integrated circuit having a plurality of input terminals, a plurality of input buffers each connected to one of said plurality of input terminals, an external output terminal, and internal circuits between respective ones of the input buffers and the external output terminal, comprising the steps of:

inputting input signals into said plurality of input terminals to drive the plurality of input buffers, including gradually changing the input signals to critical voltages at which operation of the input buffers change;

latching an output signal of each of said input buffers; and successively outputting said output signals of said input buffers to the external output terminal, undistorted by operation of the internal circuits of the semiconductor integrated circuit, to test whether the input buffers each indicate that a respective one of the input signals has a voltage that yields a lower limit or an upper limit, wherein said leading means includes nothing to distort the output signals of the input buffers.

* * * * *

UNITED STATES PATENT AND TRADEMARK OFFICE
CERTIFICATE OF CORRECTION

PATENT NO. : 5,687,180
DATED : November 11, 1997
INVENTOR(S) : Soichi KAWASAKI et al.

It is certified that error appears in the above-indentified patent and that said Letters Patent is hereby corrected as shown below:

Claim 9, column 8, line 30, "voltage" should read --voltages--.

Signed and Sealed this

Sixteenth Day of June, 1998

Attest:

Attesting Officer

BRUCE LEHMAN
Commissioner of Patents and Trademarks